United States Patent [19]

Matsumoto

[11] Patent Number: 4,884,098
[45] Date of Patent: Nov. 28, 1989

[54] IMAGE RECORDING APPARATUS
[75] Inventor: Yumio Matsumoto, Kasugai, Japan
[73] Assignee: Brother Kogyo Kabushiki Kaisha, Nagoya, Japan
[21] Appl. No.: 173,051
[22] Filed: Mar. 25, 1988
[30] Foreign Application Priority Data
  Apr. 1, 1987 [JP] Japan .................. 62-50253
[51] Int. Cl.⁴ ............................. G03B 27/72
[52] U.S. Cl. ........................ 355/27; 355/71
[58] Field of Search ............... 250/317–319; 355/27, 100, 277, 278, 279, 290, 293, 295; 354/304, 85, 86

[56] References Cited
U.S. PATENT DOCUMENTS
4,648,699 3/1987 Holycross et al. ............... 354/304
4,714,943 12/1987 Sakakibara et al. ............... 355/27

Primary Examiner—L. T. Hix
Assistant Examiner—D. Rutledge
Attorney, Agent, or Firm—Kane, Dalsimer, Sullivan, Kurcz, Levy, Eisele and Richard

[57] ABSTRACT

Disclosed is an image recording apparatus in which a photosensitive medium having a latent image formed thereon by exposure means is passed between a pair of rollers while being pressed between the rollers so that the latent image is developed by the pressure, at least one of the rollers being connected to driving means so as to be driven to repeat a forward and a reverse rotation alternately under a condition that a rotational angle in the forward rotation of the at least one roller is not smaller than a rotational angle in the reverse rotation of the same roller.

5 Claims, 2 Drawing Sheets

IMAGE RECORDING APPARATUS

BACKGROUND OF THE INVENTION

1. Field of the Invention

The present invention relates to an image recording apparatus, and particularly relates to a technique for making pressing roller means for developing a latent image on a photosensitive medium small in size.

2. Description of the Prior Art

There has been known an image recording apparatus of the system in which a photosensitive medium carrying a latent image formed thereon by exposure means is passed between a pair of rollers while being pressed therebetween so as to develop the latent image.

In the apparatus of such a system, for example, development of a latent image is achieved by making a coloring agent react upon a photosensitive agent including a dye precursor and forming the latent image for coloring through chemical combination with the photosensitive agent, and there are a case where the photosensitive agent and the coloring agent are applied onto a photosensitive medium together with each other and another case where the photosensitive agent is solely applied onto a photosensitive medium while the coloring agent is applied onto another medium separate from the photosensitive one. In the former case, pressing by pressing roller means is required for making the coloring agent react upon the photosensitive agent, while in the latter case, pressing is required not only for making the above reaction but also for transferring an image from the photosensitive medium to the other medium carrying the coloring agent.

The photosensitive medium or the photosensitive medium and the other medium piled up one on one (hereinafter referred to as "photosensitive medium and so on") are fed in one direction by feeding means so as to pass between rollers after being pressed once. In order to surely perform development by means of the above-mentioned reaction or transfer, the photosensitive medium and so on are pessed under high face pressure.

In order to press the photosensitive medium and so on under high face pressure, however, there has been a problem in that the pressing roller means is required to have high pressing capability, and the apparatus becomes large and expensive. Although it is one solution to reduce the roller means in diameter in order make the face pressure high, it is difficult to sufficiently reduce the pressing force since there is a limit in reduction of the diameter of the roller means because of restriction in wear proof on the roller surfaces, etc.

SUMMARY OF THE INVENTION

It is therefore an object of the present invention to solve the foregoing problem in the prior art.

It is another object of the present invention to provide an image recording apparatus in which pressing roller means for developing a latent image of a photosensitive medium is reduced in size.

In order to attain the foregoing objects of the present invention, the image recording apparatus comprises a pair of rollers for passing a photosensitive medium between the rollers while pressing the photosensitive medium to thereby develop a latent image formed on the photosensitive medium by exposure means, and driving means connected to at least one of the pair of rollers for driving the at least one roller so that the at least one roller repeats a forward and a reverse rotation alternately under a condition that a rotational angle in the forward rotation of the at least one roller is not smaller than a ratational angle in the reverse rotation of the same roller.

In the thus arranged apparatus, the pair of rollers function to press the photosensitive medium carrying a latent image formed thereon by exposure means on one hand, and at the same time the rollers function to feed the photosensitive medium while making the photosensitive medium repeat an advance with a feed length and a retreat with a return length alternately. At that time, the same portion of the photosensitive medium is pressed by plural times by the rollers. The condition of the repetition varies in accordance with the relation between the respective sizes of the feed length and the return length. The condition is itemized and description about the items is made hereunder.

(1) A case where the return length is smaller than a half of the feed length:

In this case, among portions of the photosensitive medium passed between the rollers by a certain feeding operation, portions having a length equal to the return length from the upstream end and downstream end, respectively, of the photosensitive medium are pressed three times, but portions between those portions pressed three times are pressed only once. Thus, the photosensitive sheet has portions pressed three times and portions pressed only once.

(2) A case where the return length is not smaller than a half of the feed length:

In this case, among portions of the photosensitive medium passed between the rollers by a certain feeding operation, portions pressed three times at the upstream and downstream sides are superposed on each other at a central portion of the photosensitive medium so that every portion of the photosensitive medium is pressed at least three times.

As described above, according to the present invention, every portion of the photosensitive medium is repeatedly pressed according to the relationship between the respective sizes of the feed length and the return length while the photosensitive medium is passed between the pair of rollers, so that enough pressing effect can be obtained even by relatively low face pressure. Therefore, the required pressing force can be reduced, and the pressing capability of the pressing roller means can be made relatively small, so that the apparatus can be made inexpensive. Further, the pressing roller means can be reduced in size, so that the body of the recording apparatus can be reduced in size.

Further, since the roller face pressure can be reduced, the power for driving the rollers necessary for passing a photosensitive medium and so on between the rollers can be made low, so that the driving means can be made small in size and the apparatus can be made inexpensive.

In the case where the return length of the photosensitive medium is set to be smaller than a half of the feed length, the photosensitive medium has a portion which is pressed only once so that the pressing at the portion is insufficient. If the feed length is made relatively small, however, the poor picture quality at the portion under insufficient pressure relative to the portion under sufficient pressure can be made inconspicuous to such an extent that there is no hindrance in practical use.

BRIEF DESCRIPTION OF THE DRAWINGS

Other features and advantages of the present invention will be apparent from the following description taken in connection with the accompanying drawings, wherein.

DETAILED DESCRIPTION OF THE PREFERRED EMBODIMENT

Figure 1:
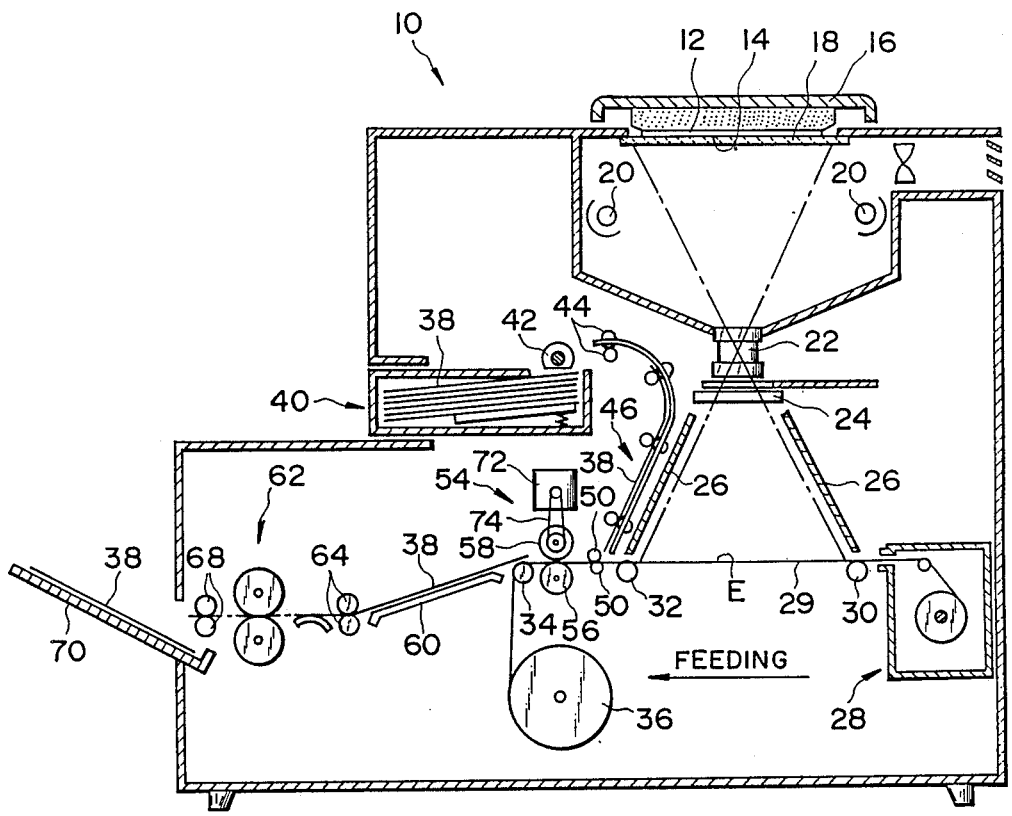
FIG. 1 is a front sectional view illustrating an embodiment of the image recording apparatus according to the present invention.

FIG. 1 is a front sectional view illustrating an embodiment of an image recording apparatus of the photosensitive system (hereinafter simply referred to as "recording apparatus") according to the present invention. In FIG. 1, in a recording apparatus 10, an original 12 is put on a glass plate 18 of the recording apparatus 10 so that a display face 14 of the original 12 having an image thereon is made to be in contact with the glass plate 18 by a cover 16. The display face 14 is irradiated with light from a light source lamp 20, so that the image-carrying carrying light reflected from the display face 14 passes through a lens 22 and a shutter 24 so as to focus the image on an exposure plane E. During non-exposing time, the shutter 24 prevents unnecessary light from invading the exposure plane E in cooperation with a light shielding hood 26. In the embodiment, the light source lamp 20, the lens 22, the shutter 24, the light shielding hood 26, and so on constitute exposure means.

On the exposure plane E, a photosensitive sheet 29 drawn out from a patrone 28 disposed in the upper stream is supported in parallel to the display face 14 of the original 12 is supporting rollers 30, 32 and 34. The photosensitive sheet 29 is made to turn downward at the supporting roller 34 positioned in the most downstream and then taken up by a take-up roller 36. The photosensitive sheet has a coating surface coated with a photosensitive agent in opposition to the light source lamp 20, so that a latent image corresponding to the picture on the display face 14 of the original 12 is formed on the coating surface. That is, in this embodiment, the photosensitive sheet 29 constitutes a photosensitive medium.

A recording sheet 38 having an coating surface coated with a coloring agent for coloring through chemical combination with the photosensitive agent is put on the latent image of the photosensitive medium 29 which has passed the exposure plane E so that the coating surface of the recording sheet 38 and the latent image are laid face to face. A suitable number of recording sheets similar to the recording sheet 38, each of which has been cut into a predetermined size in advance, are stacked in a container 40 arranged to be removable from the outside of the recording apparatus 10, so that the recording sheets 38 can be drawn out one after one on request by a feed roller 42. The drawn out recording sheet 38 is then led onto the latent image of the photosensitive sheet 29 by a sheet feed mechanism 46 provided with a feed roller 44.

In the downstream of the sheet feed mechanism 46, a pair of pressing rollers 50 are provided to press the photosensitive sheet 29 and the recording sheet 38 therebetween with slight force. The pressing rollers 50 are arranged to product frictional force between the photosensitive sheet 29 and the recording sheet 38 so that the recording sheet 38 and the photosensitive sheet 29 are made to move together with each other with no slipping.

Developing means 54 for developing the latent image of the photosensitive sheet 29 is provided between the pressing rollers 50 and the above-mentioned supporting roller 34. The developing means 54 is provided with a first roller 56 positioned on the photosensitive sheet 29 side and a second roller 58 positioned on the recording sheet 38 side so as to press the photosensitive sheet 29 and the recording sheet 38 by the first and second rollers 56 and 58 under predetermined face pressure so that the latent image of the photosensitive sheet 29 is transferred onto the recording sheet 38, and simultaneously made to be visible, that is, developed through chemical combination between the photosensitive agent and the coloring agent.

The recording sheet 38 is separated from the photosensitive sheet 29 at the supporting roller 34 and made to slide down toward the further downstream through a chute 60 disposed in the downstream of the supporting roller 34. In the downstream of the chute 60, a feed roller 64 is provided to feed the recording sheet 38 at a predetermined rate into heating roller means 62. The heating roller means 62 is arranged to heat the recording sheet 38 to a temperature within a predetermined range so as to fix the developed image, that is, picture. The feed roller 64 is located at a position at which the downstream end of the recording sheet 38 arrives after completion of pressing on the recording sheet 38 by the above-mentioned first and second rollers 56 and 58.

After completion of fixing, the recording sheet 38 is discharged into an exhaust shelf 70 by an exhaust roller 68 disposed at an outlet of the recording apparatus 10 and driven to rotate in synchronism with the feed roller 64.

The above-mentioned developing means 54 will be described more in detail.

The first and second rollers 56 and 58 are urged against each other by not-shown urging means so as to press the photosensitive sheet 29 and the recording sheet 38. The first roller 56 is freely-rotatably supported, while the second roller 58 is connected to a stepping motor 72 through a belt 74. The stepping motor 72 is fixed on a not-shown frame of the recording apparatus 10. That is, the second roller 58 functions also as a feed roller for feeding the photosensitive sheet 29 and the recording sheet 38 in the feeding direction. The second roller 58 may be connected to the stepping motor 72 through gear means in place of the belt 74.

Figure 2:
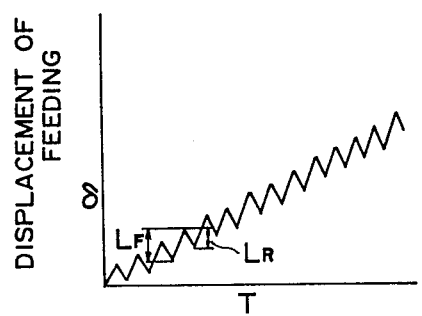
FIG. 2 is a graph illustrating the locus of a certain point (P) on a photosensitive medium and so on in the embodiment.
Figure 3:
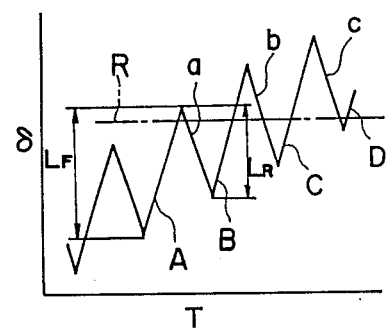
FIG. 3 is a partially enlarged graph illustrating the locus of FIG. 2.
Figure 4:
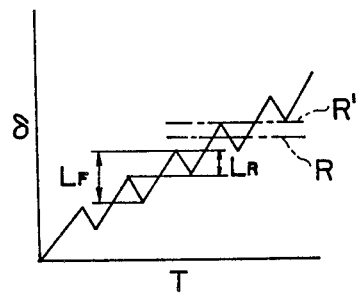
FIG. 4 is a graph illustrating the locus in the case where a return length ($L_R$) is equal to the half of a feed length ($L_F$) in the embodiment.
Figure 5:
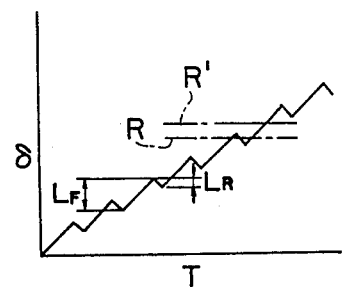
FIG. 5 is a graph illustrating the locus in an modification of the embodiment.

The stepping motor 72 is stopping during exposure. After exposure, the stepping motor 72 is driven by a not-shown driving circuit to repeat a forward rotation (rotation in the direction so as to cause the second roller 58 to feed the photosensitive sheet 29 and the recording sheet 38 in the forward direction) and a reverse rotation under the condition that the rotational angle in the reverse rotation is smaller than that in the forward rotation but not smaller than a half of that of the forward one. That is, after exposure, the photosensitive sheet 29 and the recording sheet 38 are fed while repeating an advance by a feed length $L_F$ and a retreat by a return length $L_R$ which is smaller than the feed length $L_F$ but not smaller than a half of the feed length $L_F$. That is, a certain point on the photosensitive sheet 29 and the recording sheet 38 is fed along such a locus as shown by a solid line in FIG. 2 as a point of time T proceeds. More in detail, as shown in the enlarged diagram of FIG. 3, a certain point P on the photosensitive sheet 29 and the recording sheet 38 is made to pass forwards between the rollers 56 and 58 four times by the first advance A, the second advance B, the third advance C and the fourth advance D, and to pass backwards between the rollers 56 and 58 three times by the first retreat a, the second retreat b and the third return c, so that every part of the photosensitive sheet 29 and the recording sheet 38 is fed while being pressed seven times in this embodiment. The number of pressing is varied according to the relationship between the respective sizes of the return length $L_R$ and the feed length $L_F$. For example, in the case where the return length $L_R$ is selected to be equal to the feed length $L_F$, every part of the photosensitive sheet 29 and the recording sheet 38 is fed while being pressed three times.

As is apparent from the above description, the second roller 58, the stepping motor 72, the belt 74, the driving circuit and so on constitute driving means in the embodiment.

Although the present invention has been described as to an embodiment thereof, the embodiment may be suitably modified.

For example, in a modification, the first roller 56 of the developing means 54 may be arranged to be driven also by the stepping motor 72 so that the first roller is rotated in synchronism with the second roller 58 so that slipping between the photosensitive sheet 29 and the recording sheet 38 can be prevented from occurring to thereby prevent displacement in transfer of the latent image of the photosensitive sheet 29 onto the recording sheet 38.

Alternatively, in another modification, an electric motor arranged to rotate in one direction may be used in place of the stepping motor, the electric motor being connected to the second roller 58 through a vibration generator so that rotation of the electric motor and the vibration of the vibration generator are simultaneously transmitted to the second roller 58 to thereby generate reverse rotation of the roller 58 periodically.

In a further alternative modification, the arrangement may be made such that the size of the return length $L_R$ is selected so as to be smaller than a half of the feed length $L_F$ so that part of the photosensitive sheet 29 and the recording sheet 38 at which the sheets 29 and 38 are fed while being pressed three times by repeating an advance and a retreat but other part of the sheets 29 and 38 are fed while being pressed only once. In this arrangement, the feeding rate can be increased in comparison with the foregoing embodiment.

It is taken for granted that the various changes and modifications may be made in the present invention on the basis of the knowledge of skilled person in the art without departing from the spirit or scope of the following claims.

What is claimed is:

1. An image recording apparatus comprising:
    a pair of rollers for passing a photosensitive medium between said rollers while pressing said photosensitive medium to thereby develop a latent image formed on said photosensitive medium by exposure means; and
    driving means connected to at least one of said pair of rollers rotating said at least one roller repeatedly alternately in a forward and then a reverse rotation whereby in each cycle the rotational angle during the forward rotation is not smaller than the rotational angle during the reverse rotation of the same roller.

2. An image recording apparatus according to claim 1, in which the rotational angle in the reverse rotation is set to be smaller than the rotational angle in the forward rotation but not smaller than a half of the rotation angle in the forward rotation.

3. An image recording apparatus according to claim 1, in which said driving means including a stepping motor connected to said at least one roller.

4. An image recording apparatus according to claim 1, in which said driving means including a stepping motor connected to each of said rollers so that said rollers are rotated in synchronism with each other.

5. An image recording apparatus according to claim 1, in which said driving means including an electric motor arranged to rotate in one direction and connected to said at least one roller through a vibration generator so that a reverse rotation of said at least one roller is generated periodically by vibration transmitted from said vibration generator in addition to a forward rotation transmitted from said electric motor.

* * * * *